US011503724B2

(12) United States Patent
Linderman (10) Patent No.: US 11,503,724 B2
(45) Date of Patent: *Nov. 15, 2022

(54) BULKHEAD INTERFACE AND CABLE CONNECTOR

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,623

(22) Filed: Aug. 31, 2020

(65) Prior Publication Data

US 2020/0396851 A1    Dec. 17, 2020

Related U.S. Application Data (63) Continuation of application No. 15/068,922, filed on Mar. 14, 2016, now Pat. No. 10,765,015.

(Continued)

(51) Int. Cl.
*H05K 5/00* (2006.01)
*H01R 24/76* (2011.01)
(Continued)

(52) U.S. Cl.
CPC .......... *H05K 5/0026* (2013.01); *H01R 13/64* (2013.01); *H01R 24/28* (2013.01); *H01R 24/76* (2013.01);
(Continued)

(58) Field of Classification Search
CPC ...... H05K 5/0026; H01R 13/64; H01R 24/76; H01R 24/28; H01R 2103/00; H02S 40/36; H02M 7/003; Y02E 10/50
See application file for complete search history.

(56) References Cited

U.S. PATENT DOCUMENTS 4,376,565 A * 3/1983 Bird .................... H01R 13/6456
                                              439/681
5,370,556 A * 12/1994 Olsson ................. H01R 13/645
                                              439/680

(Continued)

FOREIGN PATENT DOCUMENTS

JP    2002/009326 A    1/2002
JP    2011/040221 A    2/2011

(Continued)

OTHER PUBLICATIONS

International Search Report for Application No. PCT/US2016/022274, dated Jun. 20, 2016.

*Primary Examiner* — Rockshana D Chowdhury
(74) *Attorney, Agent, or Firm* — Moser Taboada (57) ABSTRACT

An AC trunk cable assembly and a system for coupling AC power to a power grid. In one embodiment, the AC trunk cable assembly comprises an AC trunk cable that (i) comprises at least two wires for carrying AC voltage phases, and (ii) does not have a ground wire; and a plurality of AC trunk splice connectors, spaced along the AC trunk cable, for coupling to a plurality of inverters in a one-to-one-correspondence, wherein each AC trunk splice connector of the plurality of AC trunk splice connectors comprises at least two phase-line conductors for coupling AC power from the corresponding inverter to the at least two wires of the AC trunk cable.

18 Claims, 9 Drawing Sheets

Related U.S. Application Data (60) Provisional application No. 62/132,667, filed on Mar. 13, 2015.

(51) Int. Cl.
*H01R 24/28* (2011.01)
*H02M 7/00* (2006.01)
*H01R 13/64* (2006.01)
*H02S 40/36* (2014.01)
*H01R 103/00* (2006.01)

(52) U.S. Cl.
CPC ............ *H02M 7/003* (2013.01); *H02S 40/36* (2014.12); *H01R 2103/00* (2013.01)

(56) References Cited

U.S. PATENT DOCUMENTS

| | | | | |
|---|---|---|---|---|
| 5,803,754 A | * | 9/1998 | Wilhelm | H02J 7/34 |
| | | | | 439/956 |
| 6,599,153 B2 | * | 7/2003 | Nishide | H01R 13/6456 |
| | | | | 439/271 |
| 7,108,534 B2 | * | 9/2006 | Fabian | H01R 24/84 |
| | | | | 439/295 |
| 7,153,170 B1 | * | 12/2006 | Fabian | H01R 24/84 |
| | | | | 439/295 |
| 9,584,038 B2 | | 2/2017 | Linderman | |
| 10,765,015 B2 | * | 9/2020 | Linderman | H02S 40/36 |
| 2008/0283118 A1 | * | 11/2008 | Rotzoll | H02M 7/003 |
| | | | | 136/251 |
| 2011/0084556 A1 | * | 4/2011 | Marroquin | H01L 31/02021 |
| | | | | 307/82 |
| 2012/0315783 A1 | | 12/2012 | Wiest et al. | |
| 2012/0315787 A1 | | 12/2012 | Wiest et al. | |
| 2015/0162708 A1 | * | 6/2015 | Jaan | H01R 24/22 |
| | | | | 439/354 |
| 2016/0118933 A1 | | 4/2016 | Russell et al. | |

FOREIGN PATENT DOCUMENTS

| | | |
|---|---|---|
| JP | 2011/238399 A | 11/2011 |
| WO | WO-2014/189930 A1 | 11/2014 |

* cited by examiner

BULKHEAD INTERFACE AND CABLE CONNECTOR

CROSS-REFERENCE TO RELATED APPLICATIONS

This application is a continuation of co-pending U.S. patent application Ser. No. 15/068,922 entitled "Bulkhead Interface and Cable Connector" and filed Mar. 14, 2016, which claims priority to U.S. Provisional Patent Application No. 62/132,667, entitled "Bulkhead Interface and Cable Connector" and filed Mar. 13, 2015. Each of the aforementioned patent applications is herein incorporated in its entirety by reference

BACKGROUND OF THE INVENTION

Field of the Invention

In one type of renewable energy system, photovoltaic (PV) modules are arranged in an array where each module is coupled one-to-one to a DC-AC inverter. The output AC energy is collected from each inverter using a daisy-chain AC cable that couples each inverter to each neighboring inverter, and the AC cable is generally terminated in a junction box to couple the generated AC energy to the power grid. Additionally, the PV system must be grounded to meet relevant safety standards.

Both the AC cabling and grounding for such PV systems incur costs such as materials and time. For example, the AC cable that interconnects the inverters may be custom-made and assembled in the field during the system installation of the PV module array. Such cable assembly is time-consuming, costly and fraught with error. Further, all exposed metal surfaces of the PV system (e.g., PV module metal frames and metal inverter enclosures) must be coupled to ground during the system installation, requiring the appropriate wiring and connections to be made.

The inventors herein propose a power conversion system which has efficient cabling, which does not require any connection to ground, and which enables swift and accurate AC and DC power interconnections to be safely realized.

SUMMARY OF THE INVENTION

Embodiments of the present invention generally relate to a system and apparatus for power conversion without a connection to ground and utilizing safe and reliable keying features to ensure proper alignment and orientation of AC and DC connector plugs relative to corresponding AC and DC ports of a bulkhead connector interface.

In an embodiment, an apparatus for power conversion without a connection to ground, comprises an inverter dimensioned and arranged to receive a DC input and generate, from the DC input, a first AC line voltage carrying output and a second AC line voltage carrying output, the inverter including an enclosure formed from an insulating material, and a bulkhead connector interface having a first two terminal port that receives the DC input, and a second two terminal port that couples the first and the second AC line voltage carrying outputs to an AC line. The first two terminal port comprises a first keying feature to prevent a DC plug, adapted for being plugged into the DC port, from being plugged into the AC port, and the second two terminal port comprises a second keying feature to prevent an AC plug, adapted for being plugged into the AC port, from being plugged into the DC port.

In another embodiment, a system for power conversion without a connection to ground, comprises a plurality of inverters, wherein each inverter of the plurality of inverters is dimensioned and arranged to receive a DC input and generate, from the DC input, a first AC line voltage carrying output and a second AC line voltage carrying output, and wherein each inverter includes (i) an enclosure formed from an insulating material and (ii) a bulkhead connector interface having a first two terminal port that receives the DC input, and a second two terminal port that couples the first and the second AC line voltage carrying outputs to an AC line. In one or more embodiments, the first two terminal port of each inverter of the plurality of inverters comprises a first keying feature to prevent a DC plug, adapted for being plugged into the DC port, from being plugged into the AC port, and wherein the second two terminal port of each inverter of the plurality of inverters comprises a second keying feature to prevent an AC plug, adapted for being plugged into the AC port, from being plugged into the DC port. The system further includes, in one or more embodiments, an AC trunk cable assembly comprising an AC trunk cable and a plurality of AC trunk splice connectors spaced along the AC trunk cable.

Various advantages, aspects and novel features of the present disclosure, as well as details of illustrated embodiments thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
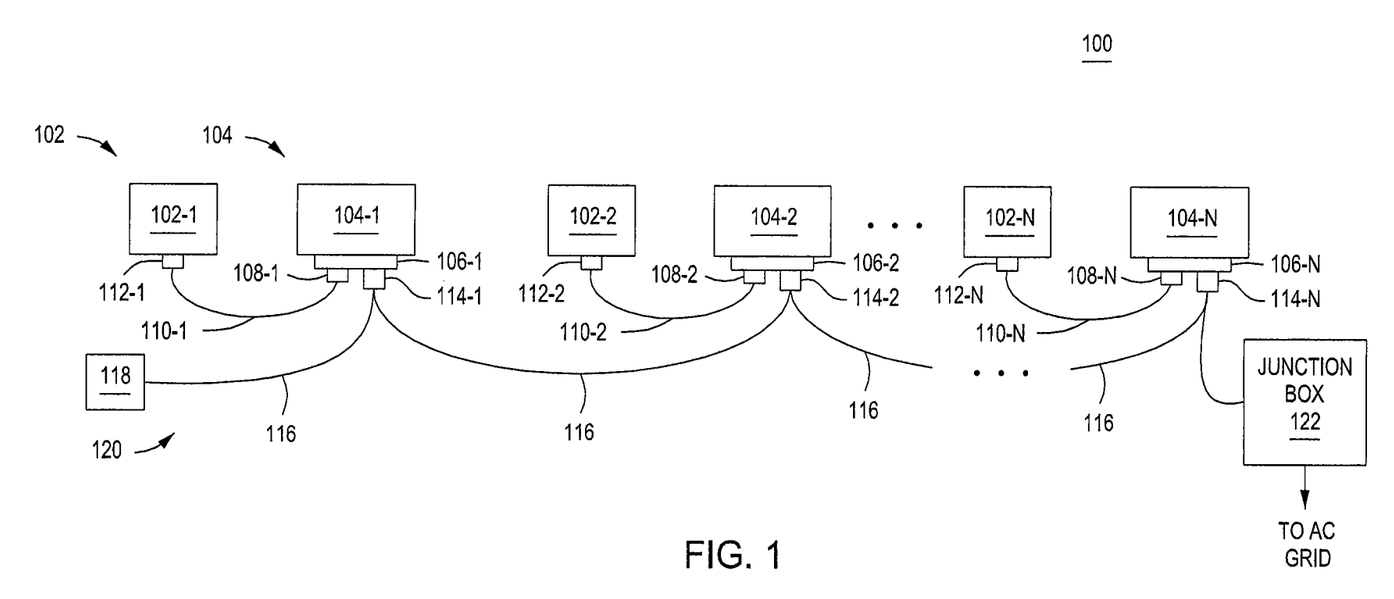
FIG. 1 is a block diagram of a photovoltaic energy system in accordance with one or more embodiments of the present invention.

FIG. 1 is a block diagram of a photovoltaic energy system 100 in accordance with one or more embodiments of the present invention. The system 100 comprises a plurality of photovoltaic (PV) modules 102-1, 102-2, . . . 102-N (collectively referred to as PV modules 102) and a plurality of power conditioning units (PCU), or inverters, 104-1, 104-2, . . . 104-N (collectively referred to as inverters 104). The PV modules 102-1, 102-2, . . . 102-N are coupled to the inverters 104-1, 104-2, . . . 104-N in a one-to-one arrangement by corresponding DC cable assemblies 110-1, 110-2, . . . 110-N (collectively referred to as DC cable assemblies 110) for providing DC power to the inverters 104—i.e., the PV module 102-1 is coupled to the inverter 104-1 by the DC cable assembly 110-1, the PV module 102-2 is coupled to the inverter 104-2 by the DC cable assembly 110-2, and so on. The inverters 104 convert the DC power received from the PV modules 102 to a single-phase AC output power.

Each DC cable assembly 110-1, 110-2, . . . 110-N, comprises a PV interface 112-1, 112-2, . . . 112-N (collectively referred to as PV interfaces 112) and a DC plug 108-1, 108-2, . . . 108-N (collectively referred to an DC plugs 108), respectively, for coupling DC power from the PV modules 102 to the inverters 104. At each PV module 102, the PV interface 112 of a DC cable assembly 110 is coupled to the PV module's DC output, and the DC cable assembly's DC plug 108 is coupled to a bulkhead connector interface assembly 106 of a corresponding inverter 104 for providing the DC power to the inverter 104 (i.e., the DC plug 108-1 is coupled to the inverter 104-1 via the bulkhead connector interface assembly 106-1, the DC plug 108-2 is coupled to the inverter 104-2 via the bulkhead connector interface assembly 106-2, and so on). In some alternative embodiments, one or more of the inverters 104 may be coupled to additional PV modules 102 for receiving DC power from multiple PV modules 102. Additionally or alternatively, one or more of the PV modules 102 may be coupled to multiple inverters 104.

The system 100 further comprises an AC cable assembly 120 that interconnects the inverters 104 to couple the generated AC power to a utility panel or junction box 122 and, ultimately, to an AC grid. In some alternative embodiments, other types of DC power sources may be coupled to one or more of the inverters 104 in addition to or instead of the PV modules 104. Such DC power sources may include batteries, DC-DC power converters, and other types of renewable energy sources such as wind farms, hydroelectric systems, or the like. In general, the AC cable assembly 120 interconnects a plurality of distributed power sources (e.g., an inverter 104 in association with a PV module 102).

The AC cable assembly 120 comprises a plurality of AC trunk splice connectors 114-1, 114-2, . . . 114-N (collectively referred to as AC trunk splice connectors 114) periodically spaced along an AC trunk cable 116. The trunk splice connectors 114-1, 114-2, . . . 114-N are coupled to corresponding inverters 104-1, 104-2, . . . 104-N via the bulkhead interfaces 106-1, 106-2, . . . 106-N, respectively, as described in detail below. The distal end of the AC trunk cable 116 is terminated in a termination cap 118, and the proximal end of the AC trunk cable 116 is coupled to the junction box 122 for coupling the generated AC power to an AC grid, such as a commercial AC power grid.

The AC trunk cable 116 may be a flat 12AWG 2-wire cable where the AC trunk splice connectors 114 are overmolded Y-splice connectors arranged to couple the inverters 104 in parallel as disclosed in U.S. patent application Ser. No. 14/725,720 filed on May 25, 2015 and entitled "Ungrounded Inverter Enclosure and Cabling." Alternatively, an arrangement of 12AWG-2 cables having a conventional circular cross-section may be used with AC trunk splice connectors 114' constructed and arranged in accordance with FIGS. 6A to 6C and described below) (collectively, AC trunk splice connectors 114). The AC trunk cable 116 may be sold as a single cable assembly having a predetermined number of AC trunk splice connectors 114, such as 32 overmolded AC trunk splice connectors 114. Alternatively, the AC trunk cable 116 may be cut to the proper length in the field during installation based on the number of inverters 104 within the array.

The spacing between the AC trunk splice connectors 114 is generally defined based on the dimensions of a PV module, as described below with respect to FIG. 8. In alternative embodiments where other types of DC power sources are used, the spacing between consecutive AC trunk splice connectors 114 may be defined based on the particular type or types of DC power sources used.

In some embodiments, a system controller (not shown) may be coupled to the AC trunk cable 116 for providing operative control of the inverters 104 and/or receiving data from the inverters 104. For example, the system controller may be a gateway that receives data (e.g., performance data) from the inverters 104 and communicates the data and/or other information to a remote device or system, such as a master controller. Additionally or alternatively, the gateway may receive information from a remote device or system, and such information may then be communicated from the gateway to the inverters 104 and/or used to generate control commands that the gateway issues to the inverters 104. In such embodiments comprising a system controller, the system controller and the inverters 104 may communicate using wired techniques (such as power line communications via the AC cable assembly 120) and/or wireless techniques, and the system controller may communicate with a remote device or system, for example via the Internet, by using wired and/or wireless techniques. Such a system controller thus provides remote monitoring capability of the performance of the PV modules 102 and the inverters 104.

In accordance with one or more embodiments of the present invention, the each inverter 104 comprises an enclosure that is formed from an insulating material, for example a blend of polystyrene and polyphenylene ether (PPE) or a polycarbonate (PC) material, such that the inverter 104 does not require any connection to ground. Further, because the inverters 104 each have an enclosure made from an insulating material and a ground wire is not required to the inverters 104, the AC trunk cable 116 only requires two line voltage carrying wires to couple the generated AC power to the AC grid. In other embodiments where one or more of the inverters 104 generates additional AC power phases, the AC trunk cable 116 requires additional wires for carrying the additional phases as well as a neutral line when used, for example split phase with three wires (L1,L2,N), three-phase with three wires (L1,L2,L3) and three-phase line-to-neutral with four wires (L1,L2,L3,N). The AC trunk cable 116 thus requires fewer wires than would be required in systems needing a ground connection, thereby simplifying the AC wiring and reducing costs over systems that require a ground connection.

Figure 2:
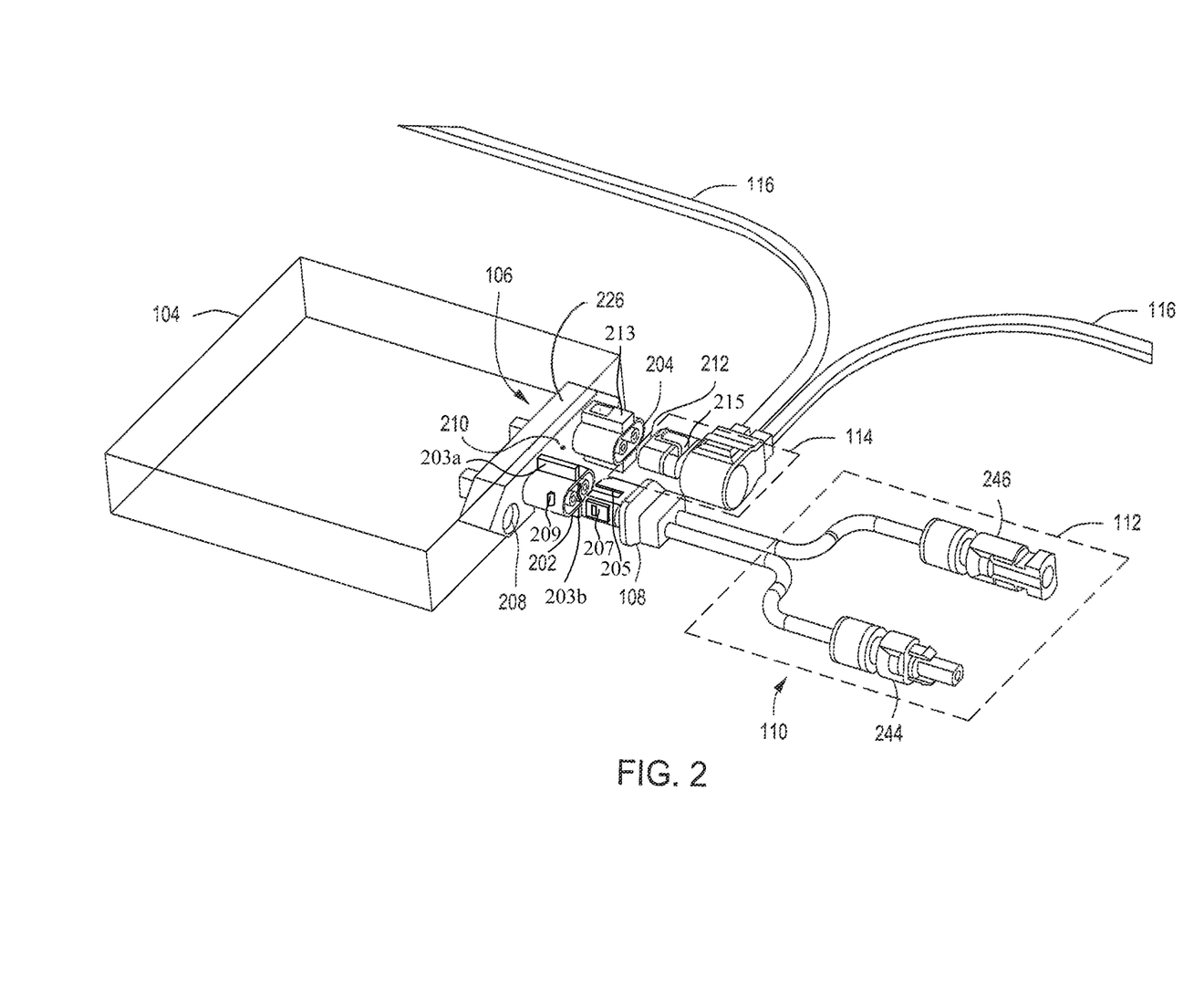
FIG. 2 depicts a side angled perspective view of an inverter, a bulkhead connector interface assembly, a DC cable assembly, and an AC trunk splice connector on a portion of an AC trunk cable in accordance with one or more embodiments consistent with the present disclosure.

FIG. 2 depicts a side angled perspective view of an inverter 104, a bulkhead connector interface assembly 106, a DC cable assembly 110, and an AC trunk splice connector 114 on a portion of an AC trunk cable 116 in accordance with one or more embodiments of the present invention. In the view depicted in FIG. 2, both the DC plug 108 and the AC trunk splice connector 114 are de-coupled from the inverter 104. Additionally, as depicted in FIG. 2, the exterior walls of the inverter 104 are shown as if transparent and the interior of the inverter 104 is depicted as empty in order to show the rear of the bulkhead connector interface assembly 106 within the inverter enclosure.

The bulkhead connector interface assembly 106, which also may be referred to as the bulkhead assembly 106, is a one-piece overmolded plastic part having metal insert DC and AC bus bars that terminate into the inverter's PCB(s) (not shown); alternatively the bulkhead assembly 106 can be made from contacts assembled into a molded plastic part. The bulkhead assembly 106 is situated on one edge of the inverter 104 and comprises a bulkhead connector interface 226 having a two-terminal AC socket 204 and a two-terminal DC socket 202. In other embodiments, the AC socket 204 may be a three-terminal socket (e.g., for a split-phase three-wire line-to-neutral configuration or a three-phase three-wire line-to-line configuration) or a four-terminal socket (e.g., for a three-phase four-wire line-to-neutral configuration). The AC socket 204 and the DC socket 202 are adapted for coupling to an AC plug 212 of the AC trunk splice connector 114 and to the DC plug 108 of the DC cable assembly 110, respectively.

The bulkhead assembly 106 further comprises a pair of DC bus bars and a pair of AC bus bars, described below with respect to FIG. 4, that are insert-molded to the bulkhead connector interface 226; alternatively, the DC and AC bus bars may be assembled into the bulkhead plastic connector interface 226 after molding. Additionally a small amount of adhesive can be dispensed around the contact to ensure moisture ingress protection. The DC and AC bus bars carry electrical current between one or more printed circuit boards (PCBs) within the inverter 104 (not shown) and the DC and AC sockets 202 and 204, respectively, as described further below.

In some embodiments, the bulkhead connector interface 226 defines a breather port 210 used for conformal coated boards having dead air space inside that needs to "breath" out and in as the air expands and contracts with temperature changes; e.g., a breathing membrane that blocks moisture (for example using GORE-TEX). For fully-potted units the breather port 210 would be a vent hole for air to escape while potting flows into the unit. After potting the hole would be plugged, for example, with a snap-fit plastic plug with an O-ring seal.

The bulkhead connector interface 226 defines a system status light indicator receptacle 208 ("light pipe receptacle 208") that displays a status light (not shown) for indicating one or more status conditions of the inverter 104.

The DC connector assembly 110 comprises the PV interface 112 (plug) that couples to the PV module DC output, and the DC interface (plug) 108 that couples to the inverter 104 via the DC socket 202. The PV interface 112 comprises PV connectors 244 and 246 that couple to the positive and negative outputs of the PV module 102, e.g., via a junction box on the PV module 102.

In accordance with one or more embodiments, and as will be described in greater detail shortly, each connector assembly as DC connector assembly 110 and AC connector assembly 116 include one or more keying features to ensure safe and accurate insertion of each connector in the proper socket. In the exemplary embodiment depicted in FIG. 2, the DC keying features include a pair of latching tabs (of which only one, indicated at reference numeral 209, is shown) on opposite lateral exterior surfaces of DC socket 202 and a pair of matching latching receptacles (of which only one, indicated at reference numeral 207, is shown) on opposite lateral sides of DC plug 108.

The DC keying features further include an asymmetric alignment post 203b which is dimensioned and arranged for insertion into a correspondingly dimensioned recess (not shown) within DC plug 108. The latter keying feature prevents insertion of the DC plug 108 in an orientation that would produce a reversal of priority. A further keying feature includes upper and lower protuberances (of which only one, indicated at reference numeral 203a, is shown). A corresponding slot or channel 205 formed within each of the upper and lower surfaces of DC plug 108 is positioned so as to be alignable with a corresponding one of the protuberances 203a of the DC socket 202. When the DC plug 108 is aligned with the DC socket 202 as shown in FIG. 2, the DC plug 108 may be safely inserted within the DC socket 202. Conversely, the location of keying features on the AC plug 212, such as upper and lower latching tabs 215, prevent insertion of the latter into the DC socket 202.

Figure 3:
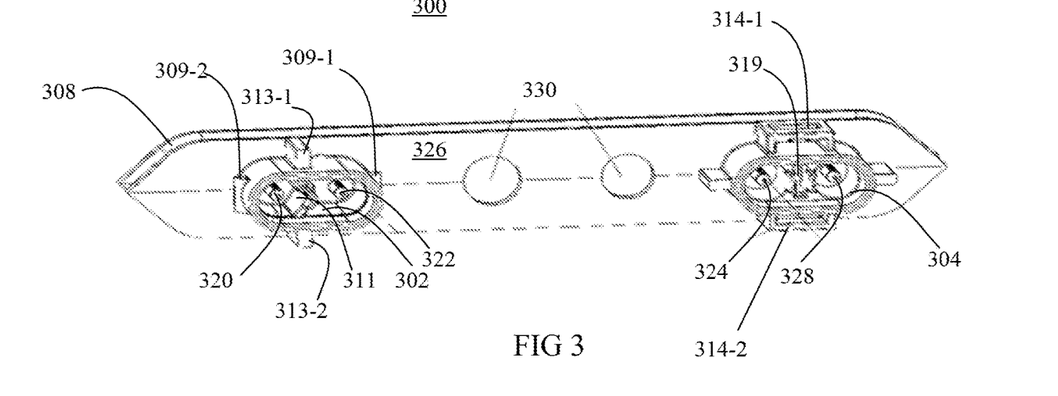
FIG. 3 is a front angled perspective view of a bulkhead connector interface assembly in accordance with one or more embodiments consistent with the present disclosure.

FIG. 3 is a front angled perspective view of a bulkhead assembly 300 in accordance with one or more embodiments of the present invention. The bulkhead connector interface 326 of the bulkhead assembly 306 is formed from an insulating material, such as a blend of polystyrene and polyphenylene ether (PPE) or a polycarbonate (PC) material, or the like. The outer edges of the bulkhead connector interface 326 have a recessed track 308 that allows an adhesive to be dispensed to seal the bulkhead assembly 306 relative to mating surfaces (not shown) of an inverter enclosure as inverter enclosure 104 of FIG. 2. A pair of ports 330 are defined in the interface 326 to enable the filling of the enclosure with a potting compound and installation of a system status light indicator.

The bulkhead connector interface 326 comprises the DC socket 302 and the AC socket 304 on its front face. The DC socket 302 is a two-terminal socket, or port, having DC slots 320 and 322 that mate with corresponding electrically-conductive pins (shown in FIG. 5 and described below) of the DC plug 108 for coupling DC power from the PV module 102 to the inverter 104.

Figure 5A:
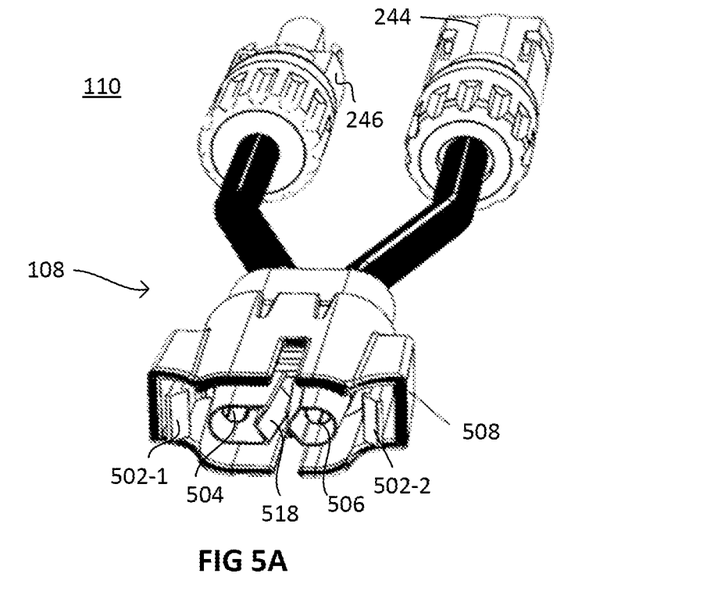
FIG. 5A is a partial perspective view of a DC cable assembly in accordance with one or more embodiments of the present invention.

The DC socket 302 comprises DC latch stops 309-1 and 309-2 (collectively referred to as DC latch stops 309 positioned on the left and right sides, respectively, of the DC socket 302. The DC latch stops 309 mate with corresponding latch tabs of the DC plug 108, described below with respect to FIG. 5, for mechanically locking the DC plug 108 to the DC socket 302. An alignment post 311 recessed within DC socket 302 extends axially between the DC slots 320 and 322. In embodiments consistent with the present disclosure, the alignment post 311 has a non-symmetrical configuration with respect to a plane which passes through the DC socket 302. This asymmetry provides a first keying feature that prevents the DC plug 108 from being plugged into the DC socket 302 with the incorrect polarity (e.g. by inserting the plug 108 upside down). Although the alignment post 311 is depicted as having a v-shaped configuration that is asymmetrical with respect to a vertical plane that bisects the DC socket 302, other shapes and configurations providing the requisite asymmetry ensuring proper orientation of an inserted plug, relative to the socket, may also be employed. Moreover, the requisite asymmetry may be with respect to any arbitrary plane passing between or through the pair of DC slots 320 and 322.

Figure 6A:
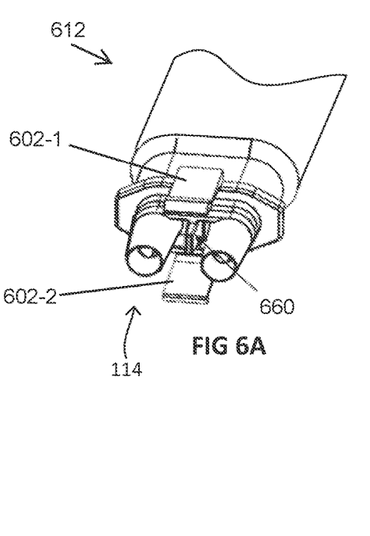
FIG. 6A is a partial perspective view of an AC trunk splice connector in accordance with one or more embodiments consistent with the present disclosure.

The AC socket 304 is a two-terminal socket, or port, having AC slots 324 and 328 that mate with corresponding electrically-conductive pins (shown in FIG. 6 and described below) of the AC plug 212 for coupling AC power from the inverter 104 to AC trunk cable 116 and ultimately to the AC grid. The AC socket 304 comprises AC latch receptacles 314-1 and 314-2 (collectively referred to as AC latch receptacles 314) positioned at the top and bottom, respectively, of the AC socket 304. The AC latch receptacles 314 mate with corresponding latch tabs or clips of the AC plug 212, described below with respect to FIG. 6, for mechanically locking the AC plug 212 to the AC socket 304. Because the inverter 104 synchronizes with the line signal to which it is coupled on the AC trunk cable 116, polarity control of the AC plug 212 is not required. Although the AC latch receptacles 314 depicted in FIG. 3 are rectangular-shaped, any suitable shape may be used.

The bulkhead connector interface 326 comprises additional keying features that prevent the DC and AC plugs 108 and 212 from being plugged into the wrong socket. For example, one or both of the DC latch stops 309 are configured differently (i.e., sized, shaped, oriented, and/or positioned) from the AC latch receptacles 314 to prevent the DC plug 108 and the AC plug 212 from being plugged into the incorrect socket. Moreover, and with continuing reference to FIG. 3, it will be seen that the DC socket 302 of bulkhead assembly 300 further includes a pair of alignment features 313-1 and 313-2 (collectively, DC alignment features 313) which extend in opposite directions (i.e., from the upper and lower exterior surfaces of DC socket 302, respectively).

The alignment features 313 are dimensioned and arranged such that only a plug having correspondingly dimensioned slots may be inserted into the DC socket 302. In that regard, and as suggested by the location of AC latch receptacles 314, a an AC plug incorporating complementary locking latches engageable with the latch receptacles 314 of AC socket 304 could not be inserted into DC socket 302 because the latches of the AC plug would make interfering contact with the DC alignment features 313. Likewise, the presence of the AC latch receptacles 314 on AC socket 304 prevents insertion of a DC plug into the AC socket 304. Finally, the AC socket 304 of assembly 300 further defines a recess 319 that is rectangular in cross section and dimensioned and arranged to receive a correspondingly shaped projection extending from within an AC plug. The presence of such a projection within the AC plug further prevents insertion into DC socket 302 as it would interfere with alignment projection 311.

Figure 4A:
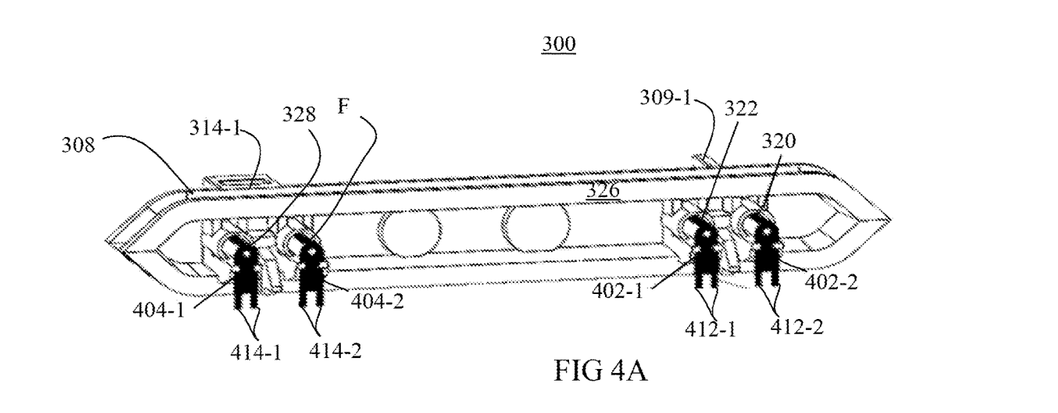
FIG. 4A is a rear perspective view of a bulkhead connector interface assembly in accordance with one or more embodiments consistent with the present disclosure.

FIG. 4A is a rear angled perspective view of bulkhead assembly 300, in accordance with one or more embodiments of the present invention. As seen in FIG. 4 and described above, the bulkhead connector interface 326 comprises the DC socket 302 including the DC latch stop 309-1, the AC socket 304 including the AC latch receptacle 314-1, and edges having the recessed track 308.

The bulkhead assembly 300 further comprises a pair of metal insert DC bus bars 402-1 and 402-2, collectively referred to as DC bus bars 402, that are insert-molded to the bulkhead connector interface 326 (or, alternatively, assembled into a pre-molded bulkhead connector interface 326 with an adhesive dispense to seal the contacts and prevent moisture ingress into the inverter 104) and extend through the rear of the DC socket 302 to provide electrical connectivity between the DC slots 320 and 322 and one or more PCBs within the inverter 104. The DC bus bars 402-1 and 402-2 terminate in press-pins 412-1 and 412-2, respectively, which are collectively referred to as press-pins 412. The press-pins 412 are press-fit tips on the DC bus bars 402 that provide solder-free fastening (both mechanical and electrical coupling) of the DC bus bars 402 to the DC connectivity points of the inverter's PCB(s) (i.e., the press-pins 412 press-fit to the PCB(s)).

The bulkhead assembly 300 further comprises a pair of metal insert AC bus bars 404-1 and 404-2, collectively referred to as AC bus bars 404, which extend through the rear of the AC socket 204 to providing electrical connectivity between the AC slots 324 and 328 and one or more of the inverter's PCB(s). The AC bus bars 404-1 and 404-2 terminate in press-pins 414-1 and 414-2, respectively, which are collectively referred to as press-pins 414. The press-pins 414 are press-fit tips on the AC bus bars 404 that provide solder-free fastening (both mechanical and electrical coupling) of the AC bus bars 404 to the AC connectivity points of the inverter's PCB(s) (i.e., the press-pins 414 press-fit to the PCB(s)). In other embodiments where the inverter 104 generates two or three AC phases, the bulkhead assembly 106 comprises additional AC bus bars 404, each coupled to a separate additional slot of the AC socket 204, for supporting the additional AC power phases.

In some alternative embodiments, the DC bus bars 402 and/or the AC bus bars 404 terminate in through-hole solder pins (e.g., through-hole solder pins may be welded on the end of the DC bus bars 402 and/or the AC bus bars 404) for through-hole soldering to one or more of the inverter's PCB(s). In some of such embodiments, bus bar extensions may be welded to the insert molded portion of the system in a secondary step after overmolding in order to provide more flexibility for bus bar routing to the PCB(s). The solder pin terminated contacts can alternatively be assembled into a pre-molded connector interface 326 with an adhesive dispense to seal the contacts and prevent moisture ingress into the inverter 104.

Figure 4B:
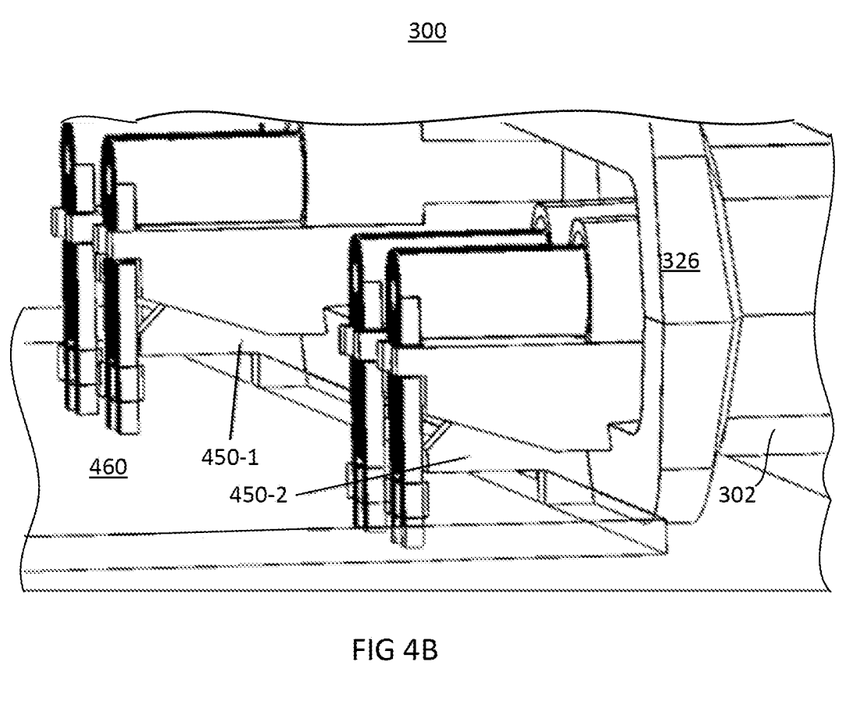
FIG. 4B is a partial perspective view of a bulkhead connector interface assembly in accordance with one or more embodiments consistent with the present disclosure.

With reference to FIG. 4B, it will be seen that connector interface 326 includes a pair of printed circuit assembly posts indicated generally at 450-1 and 450-2. The printed circuit assembly posts register the bulkhead to the top and back edge of the PCB 460 to provide a more accurate placement accuracy before soldering and to distribute loads that could develop in the solder joints if the printed circuit board assembly were to be mishandled in the manufacturing line after soldering FIG. 5A is an angled perspective view of a DC cable assembly 110 in accordance with one or more embodiments of the present invention. As previously described, the DC cable assembly 110 comprises the DC plug 108 and the PV connectors 244 and 246. The PV connectors 244 and 246 are configured for coupling to the positive and negative DC terminals, respectively, of the PV module 102 (e.g., the PV connectors 244 and 246 can be coupled to the suitable terminals of a junction box on the PV module 102). In some embodiments, the PV connectors 244 and 246 are multi-contact (MC) connectors that are made of plastic, such as polyphenylene ether (PPE), polycarbonate (PC), NORYL, LEXAN, or the like.

The DC plug 108 comprises DC latch tabs 502-1 and 502-2 (collectively referred to as DC latch tabs 502) positioned on the left and right sides, respectively, of the DC plug 108. The DC latch tabs 502-1 and 502-2 mate with the DC latch stops 309-1 and 309-2, respectively, of the DC socket 302 to mechanically lock the DC plug 108 to the DC socket 302. The DC latch tabs 502 are suitably sized, shaped and positioned on the DC plug 108 to mate with the corresponding DC latch stops 309 such that the DC plug 108 cannot be plugged into the DC socket 202 with the incorrect polarity. Additionally, the DC latch tabs 502 are suitably sized, shaped and positioned on the DC plug 108 such that they are not compatible with the AC latch receptacles 314 and the DC plug 108 cannot be plugged into the AC socket 304.

In embodiments consistent with the present disclosure, a plastic shield 508 that slides over from the cable side of the connector and becomes trapped when a spring feature locks into the connector body is provided. The shield helps to protect the exposed latches and and appropriate sealing element(s) such as O-rings or the like (not shown) and to increase options for keying the connector systems to prevent unintended insertion of the wrong plug into DC socket 302 or AC socket 304, or polarity reversal even when a plug and socket are otherwise compatible. Standard photovoltaic connectors such, for example, as MC-4 connectors, can be assembled or over-molded onto the flying wire leads.

The DC plug 108 comprises two electrically-conductive pins 504 and 506 that make electrical contact with the DC bus bars 402 (FIG. 4A) via the DC slots 320 and 322, respectively, when the DC plug 108 is mated with the DC socket 302. The DC pins 504 and 506 are electrically coupled to the PV connectors 244 and 246, respectively, for coupling DC power from the PV module 102 to the inverter 104. Each of the conductive pins 504 and 506 are surrounded by a corresponding shroud 514 and 516 which, in embodiments consistent with the present disclosure, have a respectively asymmetrical, cross sectional contour dimensioned and arranged to form a recess 518 to receive the alignment post 311 formed within the DC socket 302.

Figure 5B:
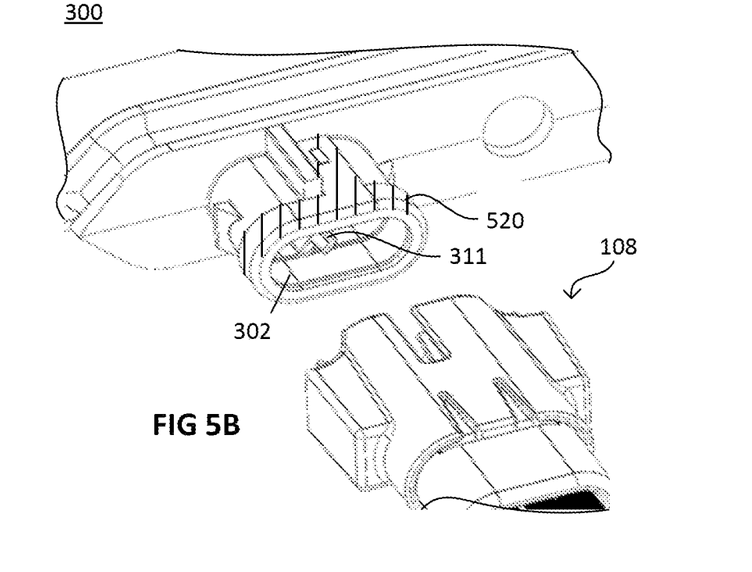
FIG. 5B is an exploded, partial perspective view depicted the alignment of the DC socket and DC connector plug of a bulkhead connector interface according to one or more embodiments consistent with the present disclosure.

FIG. 5B is a partial perspective view of the DC cable assembly 110 in accordance with one or more embodiments of the present invention, in alignment with DC socket 302 of bulkhead assembly 300. In order to ensure a robust response to accidental drops during installation the bulkhead can additionally be made with a soft plastic overmold or assembled boot 520 around the top of the socket as shown in FIG. 5. The soft boot also provides a second layer of sealing in addition to an o-ring (not shown) or other sealing element positioned at the base of the connector.

Figure 6B:
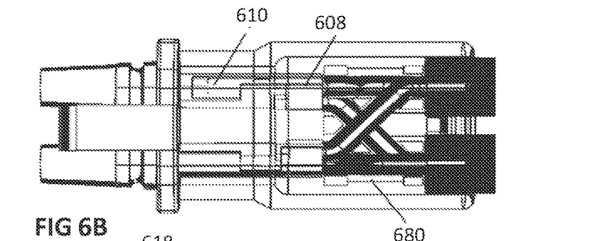
FIG. 6B a top plan view of the AC trunk splice connector of FIG. 6A with portions of the outer shell represented in transparent form to reveal an exemplary arrangement of internal components.
Figure 6C:
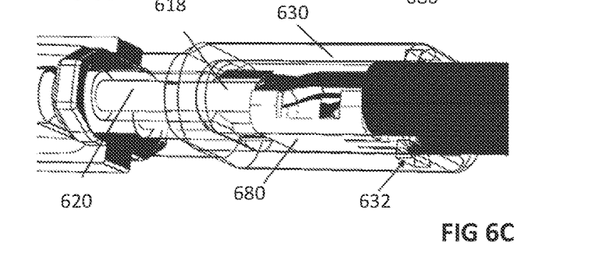
FIG. 6C is a partial side perspective view of the AC trunk splice connector of FIGS. 6A and 6B with portions of the outer shell again represented in transparent form to reveal an exemplary arrangement of internal components.

FIGS. 6A to 6C are perspective views of an AC trunk splice connector 114' in accordance with one or more embodiments of the present invention. As depicted in FIG. 6B, the exterior shell 630 of the AC trunk splice connector 114' is depicted as if transparent in order to show the electrically conductive components within the AC trunk splice connector 114'.

Connectors consistent with the present disclosure may be manufactured by overmolding a sub-assembly of the contacts and cables and by automated assembly of the contacts and cables into premolded plastic parts. FIGS. 6B and 6C shows an exemplary AC connector embodiment with components to facilitate assembly.

Within the shell 630 of AC trunk splice connector 114', a first conductor 604 (e.g., a first wire) of the AC trunk cable 116 and a second conductor 606 (e.g. a second wire) of the AC trunk cable are electrically coupled, via a first two-wire crimp zone 608 followed by a first contact pin 610. The contact pin 610 provides a contact to the Y-splice configuration, to a first AC pin 624 of the AC plug 612. A third conductor 614 (e.g., a third wire) of the AC trunk cable 116 and a fourth conductor 616 (e.g. a fourth wire) of the AC trunk cable are electrically coupled, via a second two-wire crimp zone 618 followed by a second contact pin 620. The contact pin 620 provides a contact to the Y-splice configuration, to a second AC pin 626 of the AC plug 612.

The AC pins 624 and 626 are coupled to the continuous conductors such that the conductors 604, 606, 614, and 616 are uninterrupted, thereby ensuring a low resistance for the high current in the AC trunk cable 116 from multiple inverters 104 coupled in parallel. In one or more alternative embodiments, pre-cut and stripped wire lengths are utilized with two wire ends crimped to each contact to allow for greater manufacturing flexibility.

The electrically-conductive AC pins 624 and 626 make electrical contact with the AC bus bars 404-1 and 404-2 (FIG. 4A) via the AC slots 328 and 324, respectively, when the AC plug 312 is mated with the AC socket 304. The AC power generated by the inverter 104 is thus coupled to the AC trunk cable 116 and ultimately to the AC grid.

Assembly of the connector arrangement depicted in FIGS. 6A-6C may be accomplished by crimping the 2-wire regions of each line together using an extended region of the contact pin. Alternatively a single ferrule that is not connected to the contact pin might be used for each 2-wire crimp. The contact pin could then be crimped onto the single wire that extends beyond the first crimp. After both sets of contacts are formed, the wire assembly may be pressed into a wire fixture 680 as exemplified by FIG. 6E to hold the assembly within a tighter tolerance for insertion into the connector shell 630. A series of vertical posts as post 682 guide the wires and maintain them in a desired alignment relative to the contact pins and corresponding crimp zones. The wire fixture also has a snap lock 632 on the lower surface that locks into the shell 630 when the wire and contact assembly is inserted into the shell.

Figure 6D:
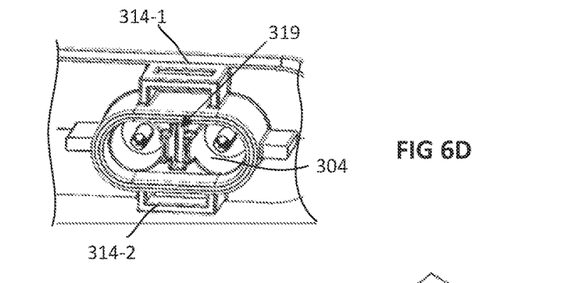
FIG. 6D is a partial perspective view of a bulkhead connector interface depicting an AC socket dimensioned and arranged to receive the illustrative AC splice connector of FIGS. 6A-6C in accordance with one or more embodiments consistent with the present disclosure.
Figure 6E:
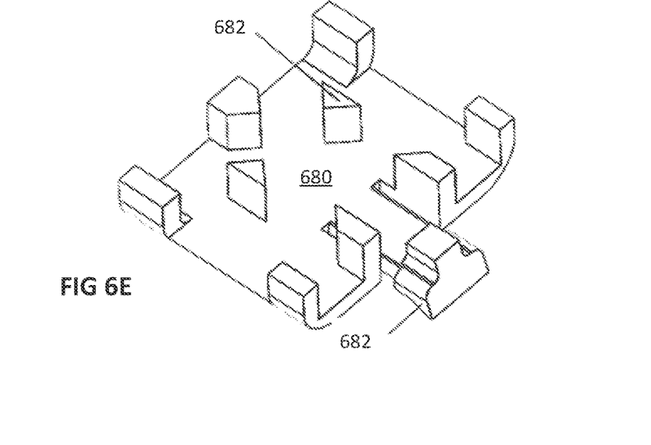
FIG. 6E is an exemplary wire fixture for holding an assembly of AC trunk conductor wires in a compact and precise alignment to facilitate close tolerance insertion within the shell of the AC connector.

While a single wire fixture 680 is shown in the connector assembly for ease of viewing, two symmetric wire fixtures would be ideally used on the top and bottom of the wire assembly to provide further strength to the assembly and stronger latching when inserted into the shell. To increase moisture ingress robustness of the connector assembly, the connector would be oriented vertically and a potting or adhesive material dispensed into the back end of the connector between cables to completely fill any dead space inside the connector and to increase mechanical strength when the cables are pulled on during installation. The connector shell could also be extended in order to provide space for a cable boot seal and cable jacket ferrules as is common in the industry to increase pull strength and moisture sealing. A similar embodiment could be used for the DC connector however only a single crimp zone would be required and there is no splicing wires internally removing a significant amount of complexity.

As best seen in FIG. 6A, the AC plug 612 comprises AC latch tabs 602-1 and 602-2 (collectively referred to as AC latch tabs 602) positioned at the top and bottom, respectively, of the AC plug 612. The AC latch tabs 602-1 and 602-2 mate with the AC latch receptacles 314-1 and 314-2 (FIG. 6D), respectively, of the AC socket 304 to mechanically lock the AC plug 612 to the AC socket 304. The AC latch tabs 602 are suitably sized, shaped and positioned on the AC plug 612 to be incompatible with the DC alignment features such that the AC plug 612 cannot be plugged into the DC socket 202. For example, as shown in FIG. 6A, AC plug 612 includes an alignment feature in the form of an axially extending post 660 having a rectangular cross section. A corresponding recess 319 in AC socket 304 is dimensioned and arranged to receive the post 660. In one or more embodiments, the DC socket 302 (FIG. 3) has a different recess shape or orientation, or also has an axially extending post so that AC plug 612 is rejected for incompatibility.

In some alternative embodiments, the AC trunk cable 116 may be a three- or four-wire cable having three or four continuous conductors throughout the length of the AC trunk cable 116. In such embodiments, the AC trunk cable conductors to which the AC pins 624 and 626 are coupled at each AC trunk splice connector 114 may be varied among the AC trunk splice connectors 114'. In this way, the pin-out combinations of the AC plug 612 are rotated among the AC trunk splice connectors 114' such that the AC line phases are rotated among the single-phase inverters 104 to generate a multi-phase AC output from the system 100. Examples of such phase rotation are described below with respect to FIG. 7. One example of such a phase rotation may be found in commonly assigned, U.S. Pat. No. 7,855,473 entitled "Apparatus for Phase Rotation for a Three-Phase AC Circuit" and issued Dec. 21, 2010.

In other alternative embodiments where the inverters 104 generate two or three phases of AC power, the AC plug 612 comprises additional AC pins and the AC trunk cable 116 may be a three- or four-wire cable having three or four continuous conductors throughout that are each Y-spliced to different AC pins of the AC plug 612. In some of such embodiments, the phase rotation described herein may also be utilized.

Figure 7:
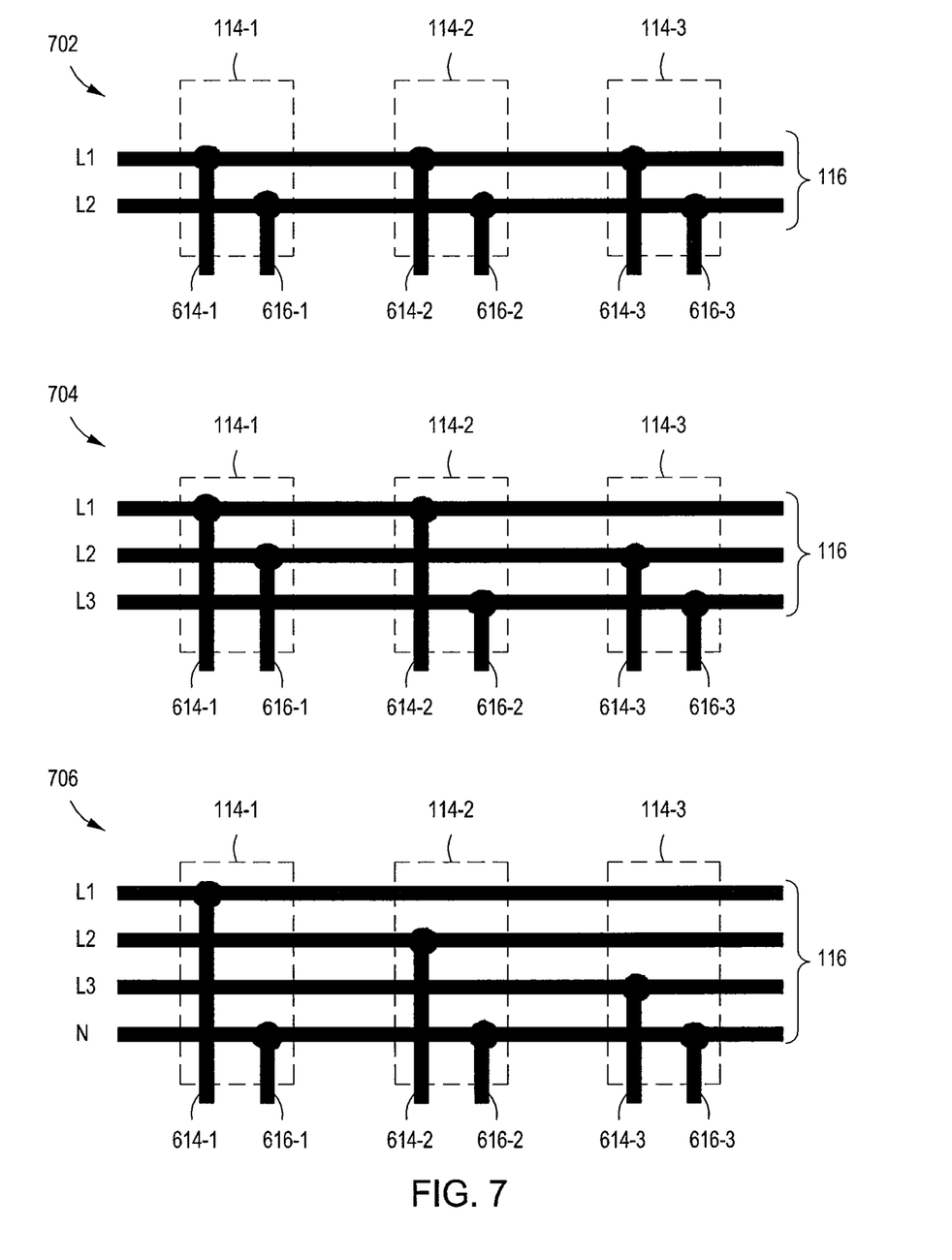
FIG. 7 is a set of diagrams depicting different AC trunk cable phase connection configurations in accordance with one or more embodiments of the present invention.

FIG. 7 is a set of diagrams 702, 704, and 706 depicting different AC trunk cable phase connection configurations in accordance with one or more embodiments of the present invention.

The diagram 702 depicts a two-wire AC trunk cable 116 comprising continuous conductors L1 and L2. As shown in the diagram 702, the AC pins 614-1, 614-2, and 614-3 of the AC trunk splice connectors 114-1, 114-2, and 114-3 are all electrically coupled to the conductor L1, and the AC pins 616-1, 616-2, and 616-3 of the AC trunk splice connectors 114-1, 114-2, and 114-3 are all electrically coupled to the conductor L2. As a result of such a configuration, a single-phase AC output is generated by the system 100.

The diagram 704 depicts a three-wire AC trunk cable 116 comprising continuous conductors L1, L2 and L3. As shown in the diagram 704, the AC pins 614-1 and 616-1 of the AC trunk splice connector 114-1 are coupled to conductors L1 and L2, respectively; the AC pins 614-2 and 616-2 of the AC trunk splice connector 114-2 are coupled to conductors L1 and L3, respectively; and the AC pins 614-3 and 616-3 of the AC trunk splice connector 114-3 are coupled to conductors L2 and L3, respectively.

The diagram 706 depicts a four-wire AC trunk cable 116 comprising continuous conductors L1, L2, L3 and N. As shown in the diagram 706, the AC pins 614-1 and 616-1 of the AC trunk splice connector 114-1 are coupled to conductors L1 and N, respectively; the AC pins 614-2 and 616-2 of the AC trunk splice connector 114-2 are coupled to conductors L2 and N, respectively; and the AC pins 614-3 and 616-3 of the AC trunk splice connector 114-3 are coupled to conductors L3 and N, respectively. As a result of such a configuration, a three-phase AC output is generated by the system 100.

Figure 8:
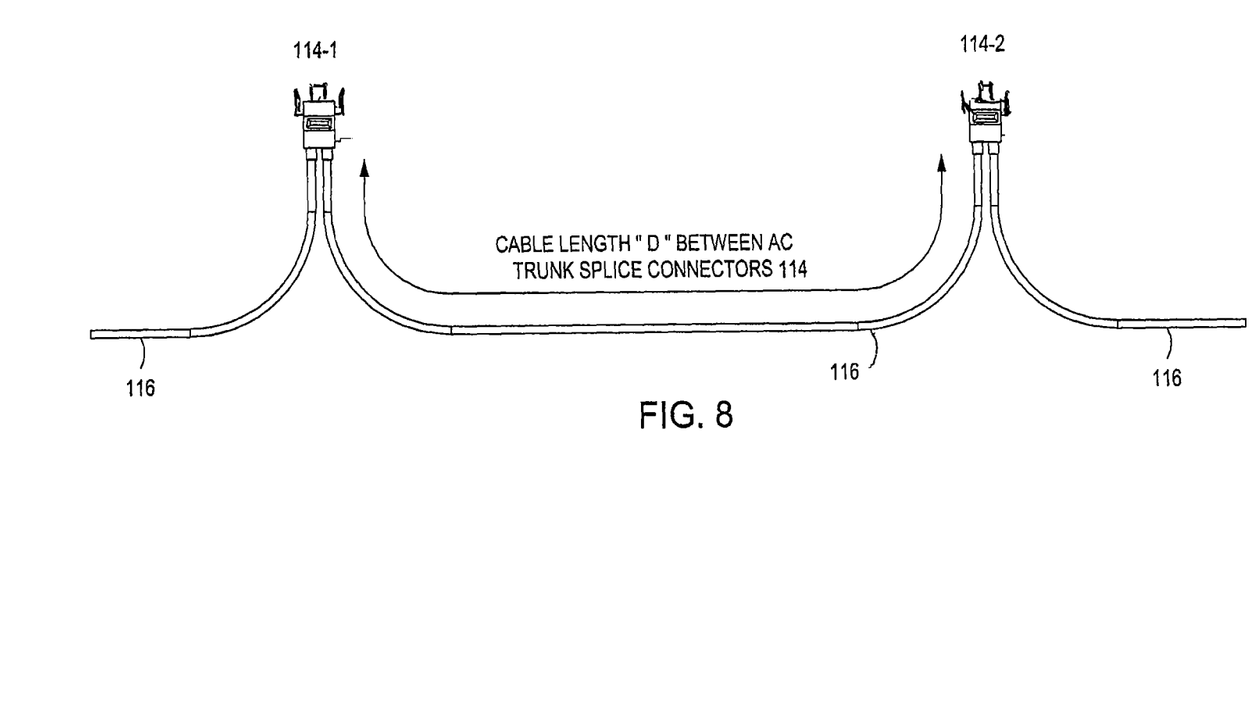
FIG. 8 is side perspective view of two consecutive AC trunk splice connectors along the AC trunk cable in accordance with one or more embodiments of the present invention.

FIG. 8 is side perspective view of two consecutive AC trunk splice connectors 114 along the AC trunk cable 116 in accordance with one or more embodiments of the present invention.

The length "D" of the AC trunk cable 116 between the AC trunk splice connectors 114-1 and 114-2 is generally based on the dimensions of industry-standard PV modules. In certain embodiments, the spacing "D" between consecutive AC trunk splice connectors 114 may be on the order of the width of a single conventional PV module (e.g., on the order of 1.1 m). In some of such embodiments, the PV modules 102 are mounted vertically (i.e., in landscape orientations) and each AC trunk splice connector 114 is coupled to a corresponding inverter 104 (e.g., as depicted in FIG. 1). In other such embodiments, the PV modules 102 are mounted horizontally (i.e., in portrait orientations) such that every other AC trunk splice connector 114 is coupled to an inverter 104 and the unused AC trunk splice connectors 114 are protectively capped or covered. In still other such embodiments, the orientations of the PV modules 102 are mixed (i.e., one or more are vertically orientated while the remaining are horizontally oriented) and any unused AC trunk splice connectors 114 are protectively capped or covered. Thus, a single cable system format can be used in a PV system having any orientation of PV modules 102.

In one or more alternative embodiments, the spacing "D" between consecutive AC trunk splice connectors 114 may be on the order of the height of a single conventional PV module (e.g., on the order of 1.9 m) such that when the PV modules 102 are mounted horizontally (i.e., in portrait orientations) each AC trunk splice connector 114 is coupled to a corresponding inverter 104.

Figure 9A:
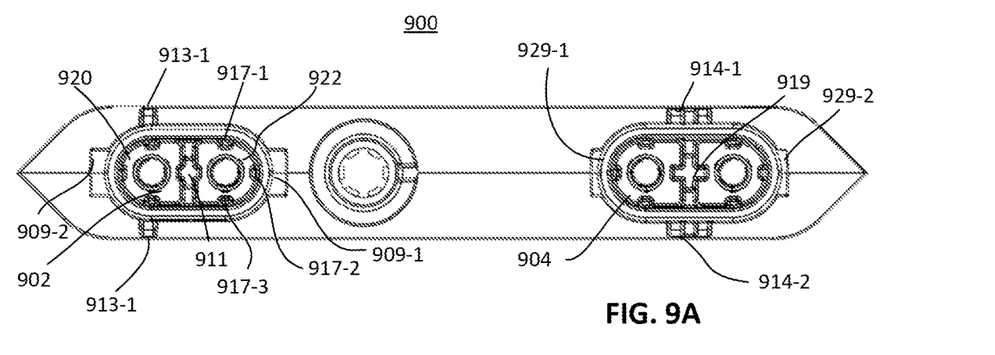
FIG. 9A is a front elevation view of a bulkhead connector interface assembly in accordance with one or more alternative embodiments consistent with the present disclosure.
Figure 9B:
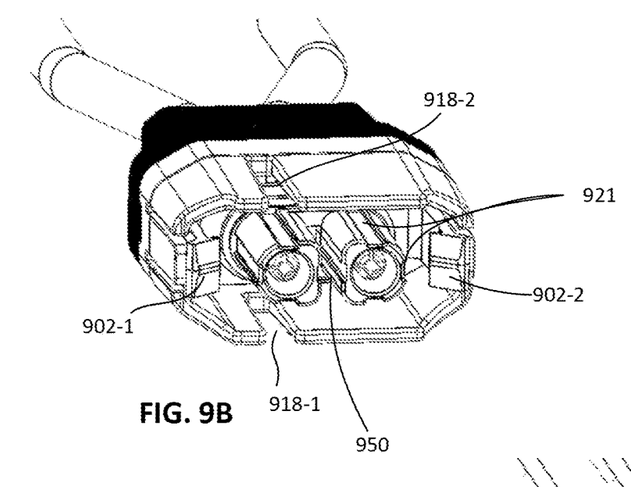
FIG. 9B is an angled perspective view depicting a DC connector having enhanced keying and alignment features in accordance with one or more alternate embodiments and dimensioned and arranged for mating insertion into the DC socket of the bulkhead connector interface assembly of FIG. 9A.

FIG. 9A is a front elevation view of a bulkhead connector interface assembly 900 in accordance with one or more alternative embodiments consistent with the present disclosure. FIG. 9B is an angled perspective view depicting a DC connector having enhanced keying and alignment features in accordance with one or more alternate embodiments and dimensioned and arranged for mating insertion into the DC socket of the bulkhead connector interface assembly of FIG.

Figure 9C:
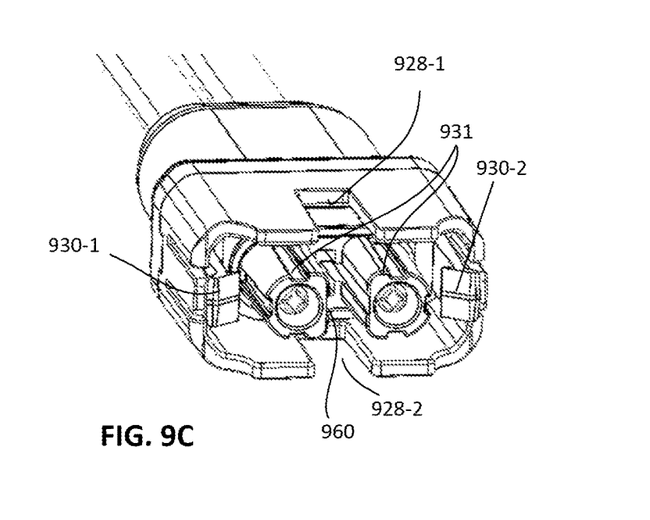
FIG. 9C is an angled perspective view depicting an AC connector having enhanced keying and alignment features in accordance with one or more alternate embodiments and dimensioned and arranged for mating insertion into the AC socket of the bulkhead connector interface assembly of FIG. 9A.

9A. FIG. 9C is an angled perspective view depicting an AC connector having enhanced keying and alignment features in accordance with one or more alternate embodiments and dimensioned and arranged for mating insertion into the AC socket of the bulkhead connector interface assembly of FIG. 9A.

The bulkhead connector interface comprises the DC socket 902 and the AC socket 904 on its front face. The DC socket 902 is a two-terminal socket, or port, having DC slots 920 and 922 that mate with corresponding electrically-conductive pins (shown in FIG. 9B and as previously described in connection with FIG. 5) of the DC plug 108 for coupling DC power from the PV module 102 to the inverter 104.

The DC socket 902 comprises DC latch stops 909-1 and 909-2 (collectively referred to as DC latch stops 909 positioned on the left and right sides, respectively, of the DC socket 902. The DC latch stops 909 mate with corresponding latch tabs 902-1 and 902-2 of the DC plug depicted in FIG. 9B to mechanically lock the DC plug of FIG. 9B to the DC socket 902 of FIG. 9A. An alignment post 911 recessed within DC socket 902 extends axially between the DC slots 920 and 922. The alignment post 911 has a "plus-sign" shaped cross section.

In embodiments consistent with the present disclosure, the DC socket 902 further includes an asymmetrical keying feature in the form of upper and lower extended features 913-1 and 913-2 (collectively, asymmetrical DC keying features 913). The keying features are asymmetrical with respect to the DC socket 902 in the sense that relative to a vertical plane bisecting the DC socket 902, the keying features 913 are present only one side of the bisecting plane and not the other. This asymmetry provides a keying function that prevents the DC plug of FIG. 9B from being plugged into the DC socket 902 with the incorrect polarity (e.g. by inserting the DC connector upside down).

The AC socket 904 is a two-terminal socket, or port, having AC slots that mate with corresponding electrically-conductive pins of the AC plug of FIG. 9C for coupling AC power from the inverter 104 to AC trunk cable 116 and ultimately to the AC grid. The AC socket 904 comprises AC latch tabs 929-1 and 929-2 (collectively referred to as AC latch tabs 929) positioned on the left and right exterior sides, respectively, of the AC socket 904. The AC latch tabs 929 mate with corresponding latching clips 930-1 and 930-2 of the AC connector of FIG. 9C, for mechanically locking the AC connector to the AC socket 904. Upper and lower projections 914-1 and 914-2 of the AC socket 904 block insertion of any AC connector configuration lacking appropriately dimensions slots 928-1 and 928-2.

The bulkhead connector interface of FIG. 9A comprises additional alignment features that provide a stable, and secure interconnection between the DC and AC plugs 108 and 212 and the corresponding DC and AC sockets 902 and 904. As seen in FIGS. 9B and 9C, the connector pins of each connector are surrounded by shrouds which define a series of radially arranged, axially extending channels or grooves indicated generally at 921 in FIG. 9B and at 931 in FIG. 9C. Corresponding axially extending projections, indicated generally at 917-1, 917-2 and 917-3 (collectively, 917) within the DC socket 904 and at 919 within the AC socket 904 are alignable with and slide within the grooves 921 and 931, respectively, as the connectors are inserted into the proper socket. A central projection 960 further prevents the AC connector from being inserted into the DC socket 902, while a corresponding recess in AC socket 904 permits only the AC connector to be inserted therein.

It will thus be readily apparent that the combination of alignment and keying features implemented in each socket and connector ensure that only a DC plug having correspondingly dimensioned slots and projections may be inserted into the DC socket 902, and then only in the proper orientation, while only an AC plug having correspondingly dimensioned slots and projections may be inserted in to the AC socket 904.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An AC trunk cable assembly for coupling AC power to a power grid, comprising:
   an AC trunk cable that (i) comprises at least two wires for carrying AC voltage phases, and (ii) does not have a ground wire; and
   a plurality of AC trunk splice connectors, spaced along the AC trunk cable, for coupling to a plurality of inverters in a one-to-one-correspondence, wherein each AC trunk splice connector of the plurality of AC trunk splice connectors comprises at least two phase-line conductors for coupling AC power from the corresponding inverter to the at least two wires of the AC trunk cable,
   wherein each AC trunk splice connector of the plurality of AC trunk splice connectors comprises a plurality of keying features that are different from a plurality of keying feature on a DC socket of the corresponding inverter, and
   wherein the plurality of keying features on the AC trunk splice connectors prevent the AC trunk splice connector from being plugged into the DC socket.

2. The AC trunk cable assembly of claim 1, wherein the AC trunk cable is a 2-wire cable comprising (i) a first wire for coupling to a first phase of AC power from the plurality of inverters, and (ii) a second wire for coupling to a second phase of AC power from the plurality of inverters.

3. The AC trunk cable assembly of claim 2, wherein the AC trunk cable is a flat 12AWG 2-wire cable and wherein the plurality of AC trunk splice connectors are overmolded Y-splice connectors arranged to couple the plurality of inverters in parallel.

4. The AC trunk cable assembly of claim 2, wherein the AC trunk cable is an arrangement of 12AWG-2 cables having a circular cross-section.

5. The AC trunk cable assembly of claim 1, wherein the AC trunk cable is a 3-wire cable comprising (i) a first wire for coupling to a first phase of AC power from the plurality of inverters, (ii) a second wire for coupling to a second phase of AC power from the plurality of inverters, and (iii) a third wire for coupling to a neutral from the plurality of inverters.

6. The AC trunk cable assembly of claim 1, wherein the AC trunk cable is a 3-wire cable comprising (i) a first wire for coupling to a first phase of AC power from the plurality of inverters, (ii) a second wire for coupling to a second phase of AC power from the plurality of inverters, and (iii) a third wire for coupling to a third phase of AC power from the plurality of inverters.

7. The AC trunk cable assembly of claim 1, wherein the AC trunk cable is a 4-wire cable comprising (i) a first wire for coupling to a first phase of AC power from the plurality of inverters, (ii) a second wire for coupling to a second phase of AC power from the plurality of inverters, (iii) a third wire for coupling to a third phase of AC power from the plurality of inverters, and (iv) a fourth wire for coupling to a neutral from the plurality of inverters.

8. The AC trunk cable assembly of claim 1, wherein each wire of the at least two wires is continuous throughout the length of the AC trunk cable.

9. The AC trunk cable assembly of claim 1, wherein the at least two wires to which the at least two phase-line conductors are coupled at each AC trunk splice connector of the plurality of AC trunk splice connectors are varied among the AC trunk splice connectors.

10. A system for coupling AC power to a power grid, comprising:
   a plurality of inverters;
   an AC trunk cable that (i) comprises at least two wires for carrying AC voltage phases, and (ii) does not have a ground wire; and
   a plurality of AC trunk splice connectors, spaced along the AC trunk cable, coupled to the plurality of inverters in a one-to-one-correspondence, wherein each AC trunk splice connector of the plurality of AC trunk splice connectors comprises at least two phase-line conductors for coupling AC power from the corresponding inverter to the at least two wires of the AC trunk cable,
   wherein each AC trunk splice connector of the plurality of AC trunk splice connectors comprises a plurality of keying features that are different from a plurality of keying feature on a DC socket of the corresponding inverter, and
   wherein the plurality of keying features on the AC trunk splice connectors prevent the AC trunk splice connector from being plugged into the DC socket.

11. The system of claim 10, wherein the AC trunk cable is a 2-wire cable comprising (i) a first wire for coupling to a first phase of AC power from the plurality of inverters, and (ii) a second wire for coupling to a second phase of AC power from the plurality of inverters.

12. The system of claim 11, wherein the AC trunk cable is a flat 12AWG 2-wire cable and wherein the plurality of AC trunk splice connectors are overmolded Y-splice connectors arranged to couple the plurality of inverters in parallel.

13. The system of claim 11, wherein the AC trunk cable is an arrangement of 12AWG-2 cables having a circular cross-section.

14. The system of claim 10, wherein the AC trunk cable is a 3-wire cable comprising (i) a first wire for coupling to a first phase of AC power from the plurality of inverters, (ii) a second wire for coupling to a second phase of AC power from the plurality of inverters, and (iii) a third wire for coupling to a neutral from the plurality of inverters.

15. The system of claim 10, wherein the AC trunk cable is a 3-wire cable comprising (i) a first wire for coupling to a first phase of AC power from the plurality of inverters, (ii) a second wire for coupling to a second phase of AC power from the plurality of inverters, and (iii) a third wire for coupling to a third phase of AC power from the plurality of inverters.

16. The system of claim 10, wherein the AC trunk cable is a 4-wire cable comprising (i) a first wire for coupling to a first phase of AC power from the plurality of inverters, (ii) a second wire for coupling to a second phase of AC power from the plurality of inverters, (iii) a third wire for coupling to a third phase of AC power from the plurality of inverters, and (iv) a fourth wire for coupling to a neutral from the plurality of inverters.

17. The system of claim 10, wherein each wire of the at least two wires is continuous throughout the length of the AC trunk cable.

18. The system of claim 10, wherein the at least two wires to which the at least two phase-line conductors are coupled at each AC trunk splice connector of the plurality of AC trunk splice connectors are varied among the AC trunk splice connectors.

* * * * *